(12) United States Patent
Tsubaki et al.

(10) Patent No.: US 8,556,638 B2
(45) Date of Patent: Oct. 15, 2013

(54) ELECTRONIC DEVICE SOCKET

(75) Inventors: Yuichi Tsubaki, Kanagawa (JP);
Masahiko Kobayashi, Kanagawa (JP)

(73) Assignee: 3M Innovative Properties Company,
St. Paul, MN (US)

( * ) Notice: Subject to any disclaimer, the term of this patent is extended or adjusted under 35 U.S.C. 154(b) by 0 days.

(21) Appl. No.: 13/061,808

(22) PCT Filed: Aug. 5, 2009

(86) PCT No.: PCT/US2009/052865
§ 371 (c)(1),
(2), (4) Date: Mar. 2, 2011

(87) PCT Pub. No.: WO2010/027597
PCT Pub. Date: Mar. 11, 2010

(65) Prior Publication Data
US 2011/0171841 A1    Jul. 14, 2011

(30) Foreign Application Priority Data

Sep. 4, 2008  (JP) .................................. 2008-227585

(51) Int. Cl.
*H01R 12/00*  (2006.01)
(52) U.S. Cl.
USPC .............................. 439/66; 439/931; 439/700
(58) Field of Classification Search
USPC .......................................... 439/66, 931, 700
See application file for complete search history.

(56) References Cited

U.S. PATENT DOCUMENTS

| 6,844,749 | B2 | 1/2005 | Sinclair |
| 7,129,728 | B2 | 10/2006 | Kinoshita |
| 7,477,062 | B2 | 1/2009 | Kinoshita |
| 7,677,901 | B1 | 3/2010 | Suzuki et al. |
| 7,927,109 | B1 * | 4/2011 | Gattuso ........................ 439/66 |
| 2004/0137767 | A1 | 7/2004 | Suzuki et al. |
| 2004/0147140 | A1 * | 7/2004 | Fan et al. ...................... 439/66 |

FOREIGN PATENT DOCUMENTS

| JP | 2001-183390 | 7/2001 |
| JP | 3099091 | 3/2004 |
| KR | 2003 16 878 Y1 | 6/2003 |
| WO | WO99/41812 | 8/1999 |
| WO | WO 2010/073460 | 7/2010 |

* cited by examiner

*Primary Examiner* — Gary F. Paumen
(74) *Attorney, Agent, or Firm* — Robert S. Moshrefzadeh

(57) ABSTRACT

To provide an electronic device socket able to shorten conductive paths between terminals of an electronic device and contacts of a circuit board. An electronic device socket (1) wherein a socket part 10 electrically connecting a plurality of terminals of an electronic device to corresponding contacts of a circuit board has a plurality of through holes 105 arranged corresponding to the positions of the terminals. Each through hole 105 has an elastic member 107 comprised of a coil spring, provided with an upper part having elasticity along a longitudinal direction of the through hole and a lower part able to form a conductive path substantially parallel to an extension direction of the through hole, a plunger 108 having conductivity biased from the elastic member toward the top surface in a second state where the electronic device is attached and the terminals and contacts of the circuit board are electrically connected, and a conductive film 106 formed at an inner surface of the through hole so as to electrically connect with near a part of the elastic member where a upper part of the elastic member and the plunger contact each other, and a lower part of the elastic member when the elastic member is compressed.

5 Claims, 4 Drawing Sheets

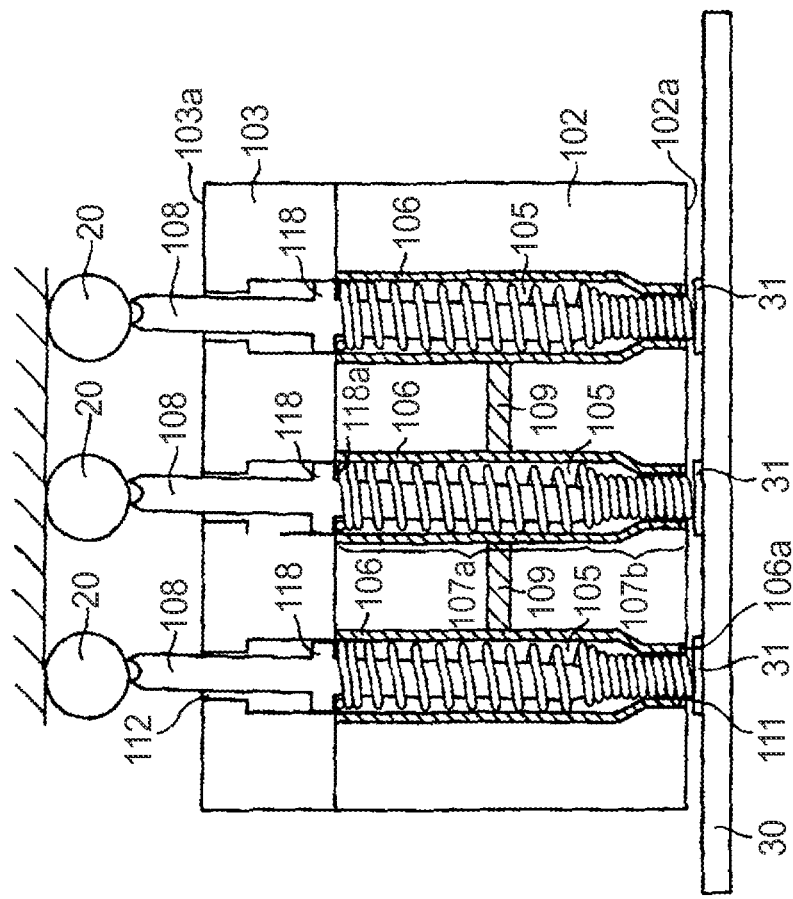
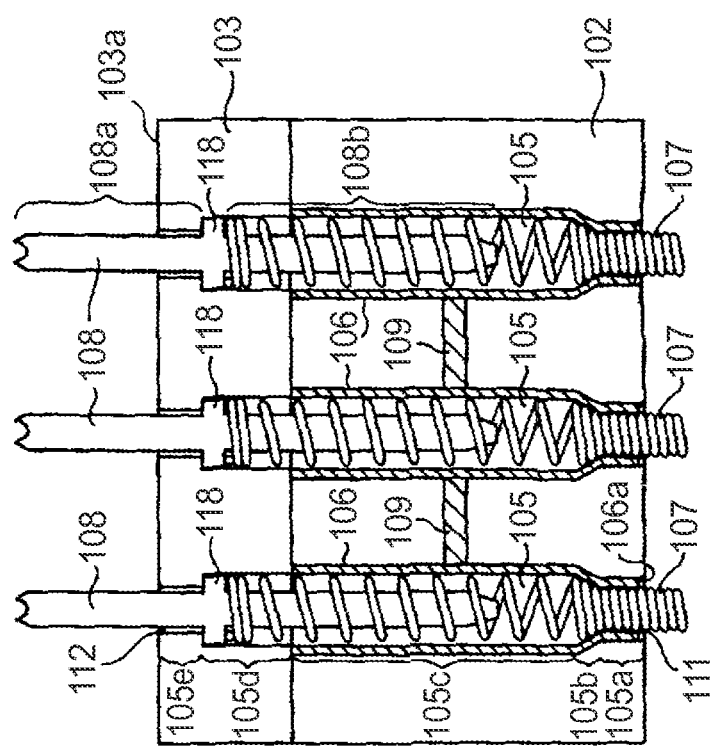
FIG. 3a
FIG. 3b

ELECTRONIC DEVICE SOCKET

CROSS REFERENCE TO RELATED APPLICATIONS

This application is a national stage filing under 35 U.S.C. 371 of PCT/US2009/052865, filed Aug. 5, 2009, which claims priority to Japanese Application No. 2008-227585, filed Sep. 4, 2008, the disclosure of which is incorporated by reference in its entirety herein.

TECHNICAL FIELD

The present invention relates to an electronic device socket.

BACKGROUND

In the past, an electronic device socket inserted between such an electronic device and a circuit board so as to detachably attach to the circuit board an integrated circuit package or other electronic device having a large number of terminals such as a land grid array (hereinafter referred to as an "LGA") or a ball grid array (hereinafter referred to as a "BGA") has been in wide use. Such an electronic device socket is provided with a plurality of contact terminals for electrically connecting the terminals of an electronic device and contacts of the circuit board. Further, in an electronic device socket, to transmit signals output from the electronic device with a high reliability to the circuit board, various configurations are provided for preventing poor conduction of the contact terminals and suppress the generation of noise (see JP Registered Utility Model No. 3099091 and WO99/41812.

For example, the Abstract of JP Registered Utility Model No. 3099091 discloses "a semiconductor package socket having an insulating board 1 forming a plate shape for carrying a BGA 21, through holes 2 passing through this board in a thickness direction, and conductive coil springs 41 contacting the inner surfaces of the through holes 2 and able to expand and contract in an axial line o-direction of the through holes 2, the coil springs 41 and solder balls 22 being electrically connected, wherein the inner surfaces of the through holes 2 are provided with metal platings 3 to enable high frequency current to flow in the axial line o-direction."

Further, the Abstract of WO99/41812 discloses "a multilayer printed circuit board 20 having at least four conductor layers comprised of ground conductor layers 23 and 25 and power conductor layers 22 and 24 alternately stacked, provided with a plurality of through hole conductors 21a, 21a', 21b, and 21c and attaching probe contacts 3a, 3b, and 3c electrically connected to terminals of a DUT 4 to the remaining through hole conductors 21, 21b, and 21c excluding at least one through hole conductor 21a'. Said ground conductor layers are electrically connected to the through hole conductors 21a and 21a', said power conductor layers are electrically connected to through hole conductors 21b, and capacitors CA and CB using the material of the printed circuit board 20 as dielectrics are formed between the ground conductor layers and the power conductor layers."

However, the operating frequencies of electronic devices have been rising in recent years. Further, along with the rise in the operating frequencies, the frequencies of the signals propagated between the electronic devices and circuit boards have also been rising. The frequencies of the signals have become 1 GHz or more in some cases. Therefore, to enable transmission of such high frequency signals with a high reliability, further improvement of the conductivity of the electronic device socket is sought.

SUMMARY OF THE INVENTION

Therefore, the present invention has as its subject the provision of an electronic device socket able to shorten the conductive paths between terminals of an electronic device and contacts of a circuit board.

According to one aspect of the present invention, there is provided an electronic device socket provided with a socket part electrically connecting a plurality of terminals of an electronic device to corresponding contacts of a circuit board and able to move between a first state where no electronic device is attached to a second state where an electronic device is attached, the terminals and the contacts being electrically connected. In the electronic device socket, the socket part has a plurality of through holes arranged corresponding to the positions of the plurality of terminals of the electronic device and opening at a top surface of the socket part facing the electronic device and a bottom surface facing the circuit board and has, at each of the plurality of through holes, an elastic member comprised of a coil spring, provided with an upper part wound in a coil shape and having elasticity along a longitudinal direction of the through hole and a lower part wound in a coil shape more densely than the upper part and able to form a conductive path substantially parallel to an extension direction of the through hole, and inserted into the through hole, a plunger having conductivity inserted into the through hole and biased from the elastic member toward the top surface in at least the second state, and a conductive film formed at an inner surface of the through hole so as to electrically connect with near a part of the elastic member where a upper part of the elastic member and the plunger contact each other, and a lower part of the elastic member when the elastic member is compressed in the second state.

According to the present invention, it becomes possible to provide an electronic device socket able to shorten the conductive paths between the terminals of the electronic device and contacts of the circuit board.

BRIEF DESCRIPTION OF THE DRAWINGS

FIG. 3(a) is a schematic partial side sectional view of a board forming the main part of a socket to which an electronic device is not attached, while (b) is a schematic partial side sectional view of a board to which an electronic device is attached.

DETAILED DESCRIPTION

Below, embodiments of the present invention will be explained with reference to the drawings.

The electronic device socket according to the embodiment of the present invention is used to connect an integrated circuit package or other electronic device with a plurality of terminals (for example, solder balls, pins, or lands) arranged in a predetermined pattern (for example, lattice or zigzag) on one main surface, for example, the bottom surface, to for example a circuit board for verifying its operation. For this reason, the socket enables an electronic device to be attached in a detachable manner. Further, this socket is formed with through holes as contact terminals for electrically connecting terminals of the electronic device and contacts of the circuit board. Conductive members are arranged in the through holes. Further, in this socket, to reduce the conductive resistance between the terminals of the electronic device and the contacts of the circuit board, the insides of the through holes are formed with conductive films to enable electrical connection of the conductive films of the contact terminals corresponding to the plurality of terminals becoming the same potential simultaneously.

Figure 1:
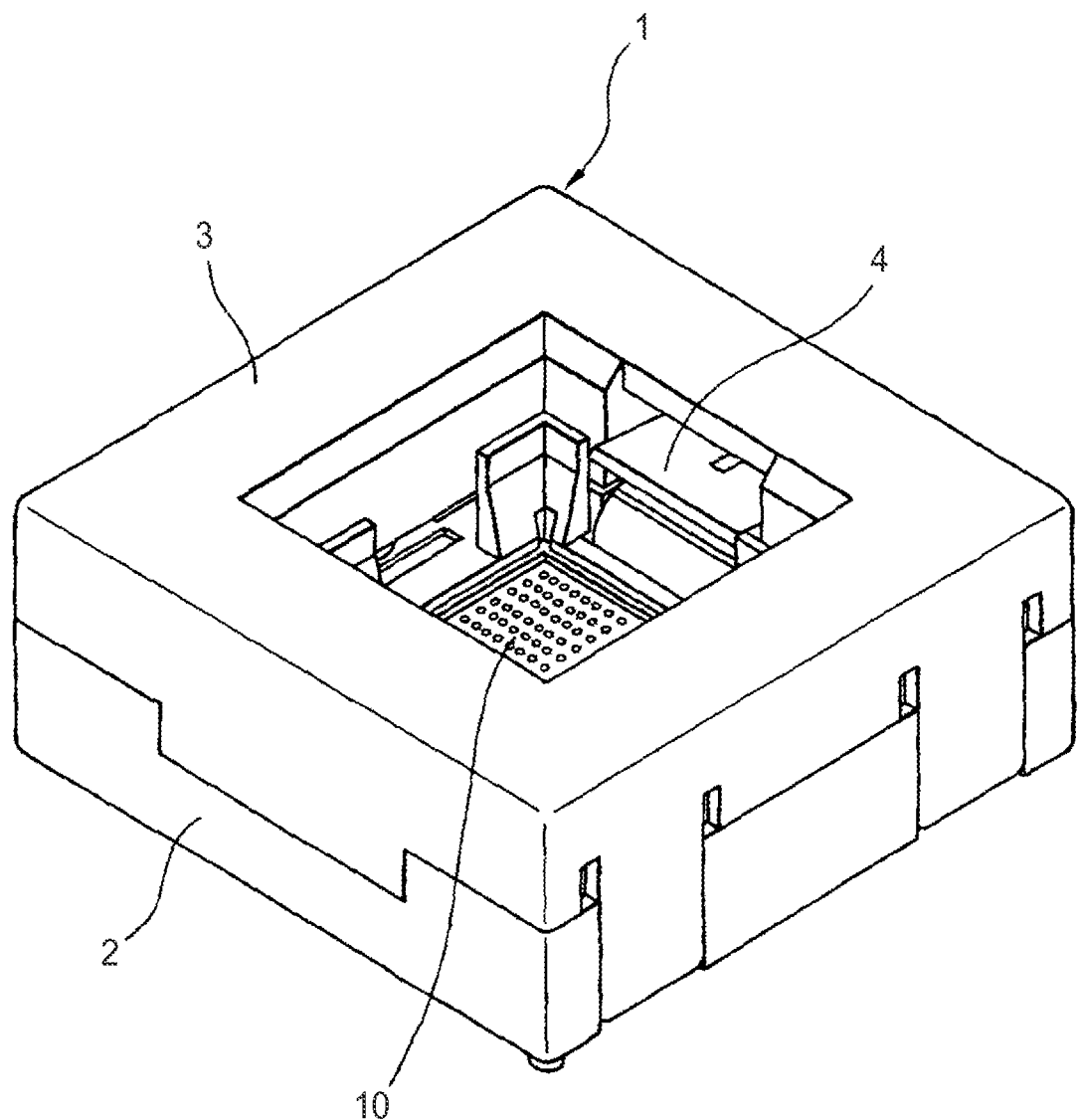
FIG. 1A schematic perspective view of an electronic device socket according to an embodiment of the present invention.

FIG. 1 is a schematic perspective view of an electronic device socket 1 according to an embodiment of the present invention. The socket 1 has a board 10, a bottom frame 2 for holding the board 10, and a top frame 3 and a pusher 4 for holding and fastening an electronic device on the board 10.

The bottom frame 2 is formed from a plastic or other electrically insulating material and has an approximately rectangular outer shape. Further, an opening part is formed at the center of the bottom frame 2. Further, the board 10 is attached to the bottom surface of that opening part. Further, the top frame 3 is also formed from a plastic or other electrically insulating material and has an approximately rectangular outer shape. Further, an opening part is formed at the center of the top frame 3 for insertion of an electronic device (not shown). The top frame 3 is attached to the bottom frame 2 in a manner enabling movement in the vertical direction. Further, when attaching an electronic device to the socket 1, if the top frame 3 is pushed down, the pusher 4 pivots in the upward direction to open. In this state, the electronic device is placed on the board 10. After this, if the force pushing down the top frame 3 is released, a spring or other biasing means causes the top frame 3 to move in the upward direction. Along with this, the pusher 4 pivots toward the electronic device. Further, the pusher 4 pushes the top surface of the electronic device to the board 10 side whereby the electronic device is fixed to the board 10.

Note that bottom frame 2, the top frame 3, and the pusher 4 can be made the various configurations employed in known electronic device sockets, so a detailed explanation of the bottom frame 2 and top frame 3 will be omitted. Further, the socket 1 may have, in addition to the top frame 3 and pusher 4, a guide frame and holding member for holding the electronic device or a lever or other component for moving the top frame 3, but all of these are known, so the explanations will be omitted.

Further, after an electronic device is placed on the board 10, sometimes a manipulator of the test system for testing the electronic device pushes the electronic device on the board 10 whereby the electronic device is held on the board 10. For this reason, the socket 1 also need not have the holder comprised by the top frame 3 and pusher 4.

Figure 2:
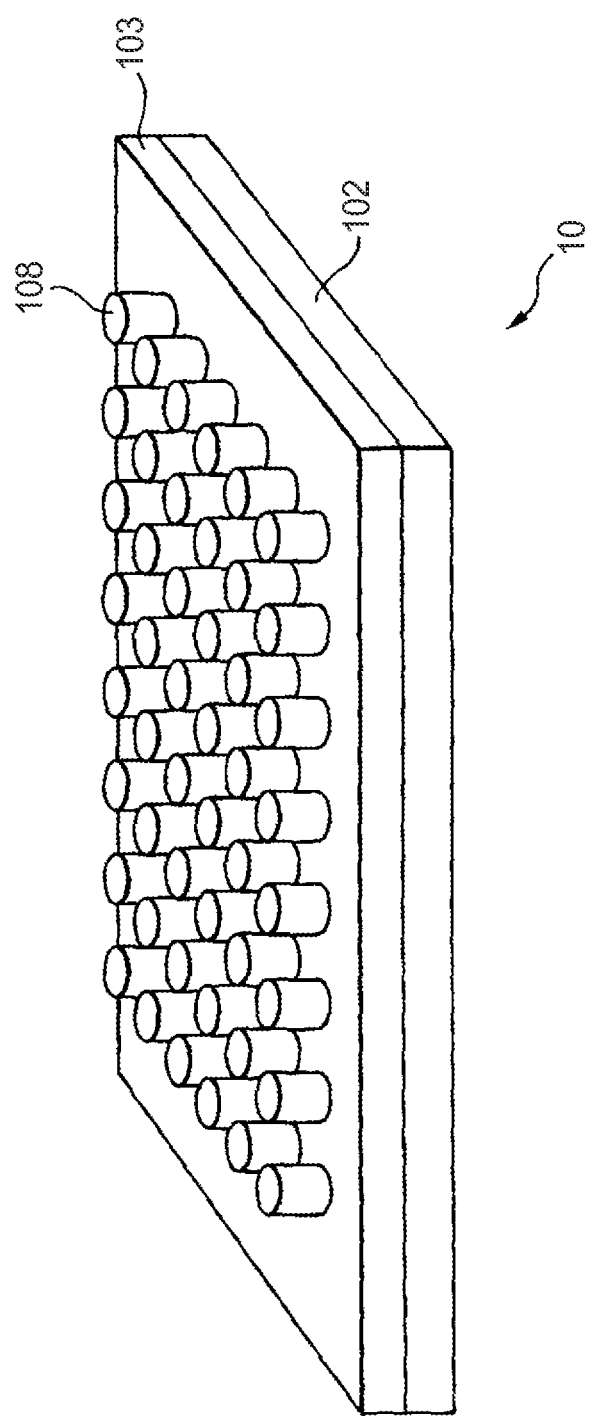
FIG. 2A schematic perspective view of a board forming a main part of a socket.

FIG. 2 is a schematic perspective view of a board 10. Further, FIG. 3(a) is a partial side cross-sectional view of a board 10 at the time of a first state where an electronic device is not attached to the socket 1, while FIG. 3(b) is a partial side cross-sectional view of a board 10 at the time of a second state where an electronic device is attached to the socket 1 and the terminals 20 of the electronic device and the contacts 31 of the circuit board 30 are electrically connected. The board forming the socket part (also called alignment board) 10 has a bottom plate 102 and a top plate 103 mainly formed by an electrical insulation material. These plates may be fabricated by injection molding or another known method. Alternatively, these plates can also be fabricated using the same method as the method of fabrication of the printed circuit board. The bottom plate 102 and the top plate 103 are connected by a bolt and nut mechanism, a latch mechanism, or other suitable connecting members (not shown). Further, the bottom surface 102a of the bottom plate 102 faces the circuit board 30 when the socket 1 is attached to the circuit board. On the other hand, the top surface 103a of the top plate 103 faces the electronic device when the electronic device is attached to the socket 1.

As shown in FIG. 2, FIG. 3(a), and FIG. 3(b), the bottom plate 102 and top plate 103 are provided with pluralities of through holes 105 passing through the board 10 in the vertical direction for forming contact terminals. These through holes 105 are arranged to correspond to the terminals of the electronic device to be attached to the socket 1, for example, at predetermined intervals in the two perpendicular horizontal directions in lattice or zigzag patterns. The pitch of the through holes 105 can be made, for example, 0.5 mm, 0.65 mm, 0.8 mm, etc.

As shown in FIG. 3(a) and FIG. 3(b), each through hole 105 has a first part 105a provided at the lower plate 102 and opening to the bottom surface 102a, a second part 105c arranged coaxially with the first part, and an inclined part 105b with an inside diameter gradually changing in an extension direction of the through hole 105 and connecting the first part 105a and second part 105c. The inside diameter at the first part 105a near the bottom opening 111 of the through hole 105 (that is, the opening facing the circuit board) is smaller than the inside diameter at the second part 105c forming the center part of the through hole 105. At the top plate 103, the through hole 105 is provided with a third part 105d having an inside diameter approximately the same as the second part 105c. Further, a fourth part 105e connected with the third part 105d and with a smaller inside diameter than the third part 105d opens at the top surface 103a as a top surface opening 112 of the top plate 103a.

At the inside surface of each through hole 105, a conductive film 106 comprised of, for example, copper, gold, or another conductive metal is formed. The conductive film 106 can be deposited on the inner surface of the plate by for example electroless plating. Alternatively, a metal foil or metal sleeve may be inserted inside the through hole 105 to provide the conductive film 106. In the present embodiment, the conductive film 106 is not provided at the inside surfaces of the third part 105d and fourth part 105e, but the conductive film 106 may also be provided at the inside surfaces of the third part 105d and fourth part 105e. The end 106a of the conductive film 106 at the bottom surface 102a of the bottom plate 102 can be positioned in substantially the same plane as the bottom surface 102a. However, the end 106a is preferably arranged further within through hole 105 than the bottom surface 102a. When the socket 1 is attached to the circuit board 30, the bottom surface 102a of the bottom plate 102 contacts the surface of the circuit board 30 or a slight gap is formed between the bottom surface 102a and the surface of the circuit board 30. If powder having conductivity etc. ends up interposed between the bottom plate 102 and the circuit board 30, the conductive film 106 and a contact 31 on the circuit board 30 are liable to short-circuit. In this case, if the end 106a of the conductive film 106 at the first part 105a is positioned above the bottom surface of the bottom plate 102, the risk of short-circuiting can be reduced.

Further, at the inside of each through hole 105, a coil spring 107 formed by a conductive metal is housed. The coil spring 107 is provided with an upper part 107a accommodated in the second part 105c and third part 105d of the through hole 105 and a lower part 107b connected to the upper part 107a. The upper part 107a has a compressible elasticity in the axial direction, that is, the extension direction of the through hole 105. Further, the upper part 107a has an outside diameter substantially the same or smaller than the inside diameter of the second part 105c of the through hole 105 having the conductive film 106. The lower part 107b is formed continuing from the upper part 107a. At the lower part 107b, the spring is wound denser than the upper part 107a. Further, the outside diameter of the lower part 107b is smaller than upper part 107a and is substantially the same as or smaller than the inside diameter of the first part 105a of the through hole 105. Therefore, the diameter of the upper part 107a of the coil spring 107 (that is, the part positioned in the second part 105c of the through hole 105) is larger than the inside diameter of the first part 105a of the through hole 105. For this reason, at the board 10, the coil spring 107 can be prevented from detaching from the through hole 105. Furthermore, the length of the upper part 107 of the coil spring 107 has a length approximately the same as the sum of the second part 105c and third part 105d of the through hole 105. On the other hand, the length of the lower part 107b of the coil spring 107 is longer than the first part 105a of the through hole 105. Therefore, the coil spring 107 inserted into the through hole 105 sticks out at its lower part 107b from the opening 111 of the bottom of the through hole 105. When the socket 1 is attached to the circuit board 30, the bottom end of the coil spring 107 contacts the contact 31 of the circuit board 30 whereby it is electrically connected. Further, the later explained plunger 108 is in a state biased by the coil spring 107 in the upward direction at all times.

Furthermore, the lower part 107b of the coil spring 107 is configured so that when the coil spring 107 is in the free state (state where no compressive force is received), the adjoining turns of the spring contact each other. For this reason, at the lower part 107b of the coil spring 107, the cross-sectional area of the conductive path formed by the coil spring 107 and conductive film 106 becomes broader, so the conductive resistance of the conductive path can be reduced. Further, the conductive path may be formed not into a coil shape, but a straight shape substantially parallel to the extension direction of the coil spring 107. For this reason, even if a high frequency signal is applied to the electronic device, it is possible to suppress the occurrence of inductance at this part. In the present embodiment, by changing the outside diameter and winding pitch of one spring, an upper part 107a and a lower part 107b are formed. For this reason, it is possible to fabricate an elastic member at a lower cost by a smaller number of parts.

As another embodiment, the lower part of the coil spring may be configured so that the adjoining turns of the spring do not contact each other in the free state and configured so that when an electronic device is placed on the socket 1 and the coil spring is compressed, that is, in the second state, the adjoining turns of the spring at the lower part contact each other. When the coil spring is formed so that the adjoining turns of the spring at the lower part of the coil spring contact each other in advance, a conductive path is formed substantially parallel to the extension direction of the coil spring regardless of the degree of compression of the coil spring, so it is possible to more reliably shorten the conductive path.

On the other hand, in the second part 105c of the through hole 105, the coil spring 107 is sparsely wound, so the coil spring 107 has elasticity along the longitudinal direction of the through hole 105.

In the present embodiment, a single coil spring forms an elastic member, but the elastic member may also be formed by another means. For example, it is also possible to insert two coil springs with different outside diameters or spring constants in series in the through hole 105. Further, these coil springs may also be made integral.

Alternatively, the lower part of the coil spring may also be comprised of a metal sleeve or metal rod. Further, near the top end of the metal sleeve or metal rod, this may be connected with the upper part of the coil spring by a known method. As the connecting method, for example, it is possible to employ the method of mechanically engaging these or the method of bonding them by a conductive adhesive. Furthermore, the upper part of the coil spring need only be an elastic member having conductivity. The upper part, for example, may be comprised of an elastomer having conductivity, an air spring comprised of a conductive material, a plate spring compressible in the extension direction of the through hole 105, etc.

Further, each through hole 105 accommodates an elongated pin shaped plunger 108 formed from a conductive metal for electrically connecting a terminal of the electronic device and the coil spring 107 and conductive film 106. As shown in FIG. 3(b), when an electronic device is attached to the socket 1, the top end of each plunger 108 sticks out from the opening of the top of the through hole 105 so as to reliably contact the terminal 20 of the electronic device. On the other hand, the bottom end of the plunger 108 is inserted into the inside of the coil spring 107. Further, at the approximate center of the plunger 108 in the longitudinal direction, a flange 118 with a diameter larger than the other parts of the plunger is formed. A bottom end 118a of the flange 118 is engaged with a top end of the coil spring 107. For this reason, when an electronic device is attached to the socket 1 and the terminals of the electronic devices push the plungers 108 down, the plungers 108 move downward and the plungers 108 compress the coil springs 107 along the longitudinal direction of the through holes 105. Due to this, the plungers 108 and the coil springs 107 reliably contact each other and poor connection of the plungers 108 and coil springs 107 is prevented. Further, the contact areas of the plungers 108 and coil springs 107 and the conductive films 106 increase, so the resistance of the conductive paths from the plungers 108 and coil springs 107 through the conductive films 106 can be reduced.

Note that the length of each plunger 108 is preferably designed so that even when the plunger 108 is positioned at the bottom end of the range of movement (that is, the second state), the bottom end of the plunger 108 is housed in the part of the through hole 105 with the large inside diameter (that is, the second part 105c). By designing the length of the plunger 108 in this way, when an electronic device is detached from the socket 1, it is possible to prevent the bottom end of the plunger 108 from being caught at the thin diameter part of the coil spring 107 and being unable to be pulled out.

Further, in the second state, preferably the bottom end part of the plunger 108 contacts the sparsely wound part of the coil spring 107. If the plunger 108 contacts the inner circumferential surface of the coil spring 107, the coil spring 107 flexes and the elastic springback force causes the plunger 108 to be pushed back by the coil spring 107. When this elastic springback force is large, the wear between the coil spring 107 and the plunger 108 becomes larger and the movement of the plunger 108 in the vertical direction is liable to be obstructed. The rigidity of the densely wound part of the coil spring 107 becomes higher than the rigidity of the sparsely wound part. For this reason, when the bottom end part of the plunger 108 contacts the coil spring 107, having the part of the coil spring 107 contacted sparsely wound enables the elastic springback force acting on the plunger 108 to be made smaller and thereby enables smooth movement of the plunger 108 in the vertical direction.

Furthermore, the densely wound part of the coil spring 107 is preferably short. Preferably, the upper part 107a of the coil spring 107 is substantially comprised of only the sparsely wound part. In the disclosed socket, warping of the electronic device or variation in size of the terminals 20 causes variation in the positions of the terminals 20 in the height direction. To enable reliable electrical connection between the terminals 20 and contacts 31 of the circuit board 30 at this time, preferably the amounts of movement of the plungers 108 in the vertical directions are as large as possible. The shorter the densely wound parts of the coil springs 107, the longer the dimension of the sparsely wound part of the coil spring 107 giving the elasticity in the longitudinal direction. For this reason, when the heights of the sockets 1 are the same, the shorter the densely wound parts of the coil springs 107, the greater the amounts of movement of the plungers 108 can be made. Furthermore, if it is possible to increase the amounts of movement of the plungers 108, the spring constants of the sparsely wound parts can be reduced. For this reason, even if the positions in the height directions of the terminals 20 (long axis directions of through holes 105) differ, the change in the contact pressures between the plungers 108 and terminals 20 becomes smaller and stable contact states can be obtained.

Furthermore, each through hole 105 is narrowed in inside diameter near the top opening 112. The narrowed part engages with the top end of the flange 118 of the plunger 108 and defines the top end of the range of movement of the plunger 108.

The length of the upper part 108a of the plunger positioned at the upper side from the flange 118 of the plunger and extending to the top surface 103a side of the board 10 at the outside of the coil spring 107 and the length of the lower part 108b of the plunger positioned at the lower side from the flange 118 and inserted into the upper part 107a of the coil spring 107 can be made any lengths. For example, the length of the lower part 108b may be substantially the same or longer than the length of the upper part 108a. When the plunger is pushed down by the electronic device, positional deviation from the terminal 20 or bending of the coil spring 107 results in tilting the plunger from the long axis direction of the through hole 105. For this reason, if configuring the plunger 108 in this way, when the plunger 108 is tilted by being pushed down to the bottom side, compared with the amount of deviation of the top end of the plunger 108 from the center of the through hole 105, the amount of deviation of the bottom end from the center of the through hole 105 becomes substantially the same or more. For this reason, the bottom end part of the plunger 108 and coil spring 107 and the coil spring 107 near the bottom end part and conductive film 106 can be brought into contact more reliably. Note that the "bottom end part" is understood as a term not limited to only the front end of the plunger and including the vicinity of the front end adjoining the front end.

On the other hand, the length of the lower part 108b may be shorter than the length of the upper part 108a. The shorter the length of the lower part 108b of the plunger 108, the greater the allowance with respect to positional deviation of the terminal of the electronic device. When the terminal 20 is arranged offset from the center of the through hole 105, to make the plunger 108 and the terminal 20 contact each other, the plunger 108 has to be tilted corresponding to the positional deviation of the terminal 20 from the center of the through hole 105. This is because the shorter the length of the lower part 108b, the larger the inclination of the plunger 108 from the long axis direction of the through hole 105 can be made when the bottom end part of the plunger 108 abuts against the inner surface of the through hole 105 through the coil spring 107.

Here, part of the terminals among the plurality of terminals of the electronic device sometimes simultaneously become the same potential. For example, an electronic device has a plurality of ground terminals and the potentials of these ground terminals become the same at all times. Further, an electronic device sometimes has a plurality of power terminals, a plurality of heat radiating terminals, or a plurality of signal terminals outputting the same signals or receiving as input the same signals. Further, the potentials of the power terminals become the same at all times. Similarly, the potentials of the heat radiating terminals and the potentials of the signal terminals also become the same simultaneously.

Therefore, as shown in FIG. 3(a) and FIG. 3(b), a conductive layer 109 for electrically connecting the conductive films 106 provided at the plurality of through holes 105 corresponding to the plurality of terminals having simultaneously the same potential of the electronic device can be formed at the inside of the bottom plate 102. For example, at the socket 1 as well, by electrically connecting the contact terminals corresponding to the plurality of ground terminals, the conductive paths over which the signals are transmitted are surrounded by conductive layers 109 having a ground potential, so it is possible to give resistance to the effect of outside noise. Further, the conductive layer 109 may be formed between the top plate 103 and bottom plate 102 or at the top surface of the top plate 103. However, by providing the conductive layer 109 at the inside of the bottom plate 102, it is possible to prevent the conductive foreign matter mixed in during the assembly step of the socket etc. from contacting the conductive layer 109. For this reason, it is possible to prevent the occurrence of the problem of short-circuiting between terminals of the electronic device outputting different signals due to contact of foreign matter. The conductive layer 109 may be deposited at the surface or inside of the bottom plate 102 by electroless plating or another method. Copper foil or other metal foil may also be bonded to the surface or inside of the bottom plate 102 as a conductive layer 109.

Figure 4A:
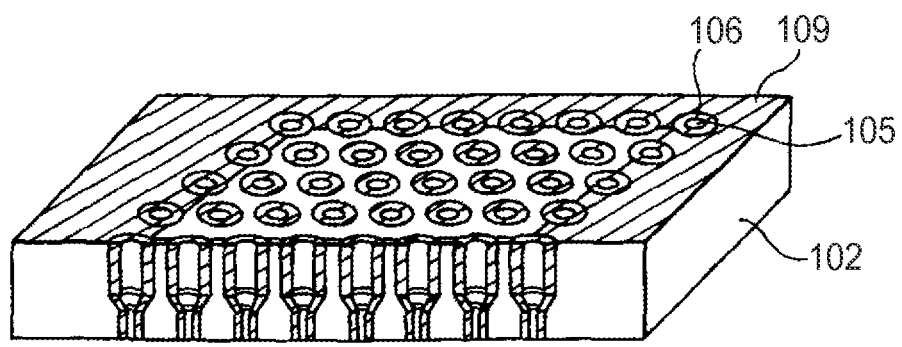
FIG. 4(a) to (c) are schematic cross-sectional perspective views of bottom plates showing examples of a conductive layer.
Figure 4B:
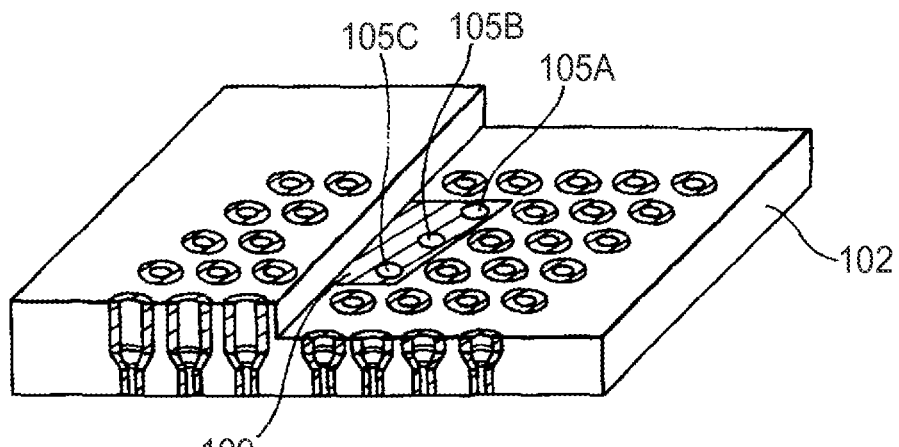
Figure 4C:
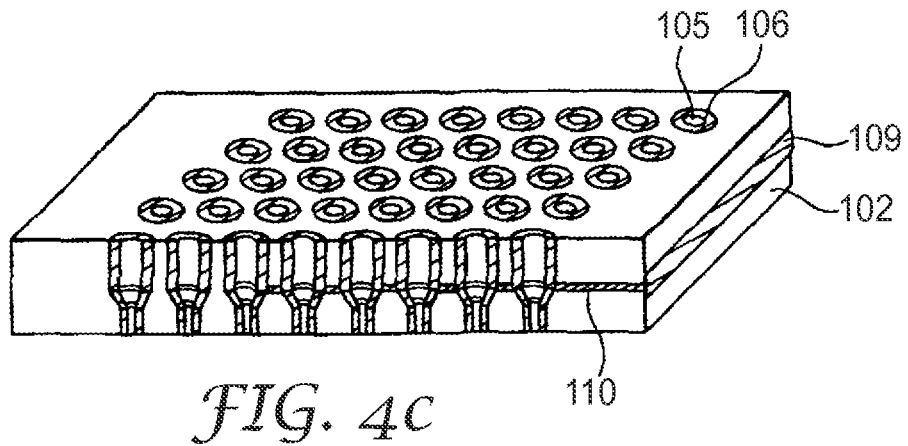

FIGS. 4(a) to (c) are schematic cross-sectional perspective views of the bottom plate 102 cut horizontally for showing examples of the conductive layer 109. In the example shown in FIG. 4(a), the conductive layer 109 electrically connects the conductive films provided in the through holes 105 arranged at the outermost periphery.

Further, in the example shown in FIG. 4(b), the conductive layer 109 electrically connects conductive films provided at a plurality of through holes 105A to 105C arranged at the center of the board 10.

Furthermore, in the example shown in FIG. 4(c), the conductive layer 109 is formed at outer circumferential side surfaces of the bottom plate 102. Further, conductive wires 110 are formed in the bottom plate 102 to electrically connect the conductive films 106 provided at the through holes 105 corresponding to the terminals of the electronic device simultaneously having the same potential or terminals called "thermal bores" formed just for the purpose of heat dissipation of the electronic device and the conductive layer 109. When configured in this way, the conductive layer 109 can function also as a heat radiating path and can more efficiently dissipate the heat produced by the electronic device through the socket 1. The conductive layer 109 exposed at the outer circumferential side surface of the bottom plate 102 can further improve the heat dissipating effect if brought into contact with a member of the socket 1 responsible for heat dissipation (not shown).

Next, the procedure for using the disclosed electronic device socket 1 to measure an electronic device will be explained.

First, the disclosed electronic device socket 1 is fixed to the circuit board by screws or another known technique. At this time, the socket 1 is fixed in the state where the contacts 31 of the circuit board 30 and the through holes 105 of the socket 1 are aligned with each another. As shown in FIG. 3(*b*), the bottom surface 102*a* of the board 10 is arranged on the circuit board 30 in the state in contact with the surface of the circuit board 30 or through a slight gap. The bottom ends of the coil springs 107 are made to abut against the contacts 31 of the circuit board 30, so the coil springs 107 move upward in the figure (upper surface side of the board 30) and gaps occur between the inclined parts 105*b* of the through holes 105 and the coil springs 107 (first state).

Next, the electronic device is arranged on the board 10 so that the terminals 20 of the electronic device and the through holes 105 match in position. Further, due to the pusher 4 of the socket 1, the electronic device is biased toward the board 10 (second state).

At this time, each coil spring 107 is compressed, the plunger 108 tilts from the longitudinal direction of the through hole 105 or the coil spring 107 bends and the bottom end part of the plunger 108 contacts the inner circumferential side of the coil spring 107. Further, near the part where the bottom end part of the plunger 108 and the coil spring 107 contact each other, the coil spring 107 contacts the conductive film 106. Due to this, a conductive path is formed minimizing the length of the spring part of the coil spring 107 which current flows through, and electrically connecting the bottom end part of the plunger 108 and conductive film 106. In this case, a conductive path is formed where the current cuts across the turns of the coil spring 107 from the bottom end part of the plunger 108 and immediately flows to the conductive film 106. For this reason, since current does not flow along the spiral of the upper part 107*a* of the coil spring 107, the generation of inductance can be suppressed and the cross-sectional area of the conductive path can be increased and the conductive path can be made the shortest.

Further, the lower part 107*b* of the coil spring 107 is also tilted somewhat from the extension direction of the through hole 105, so the lower part 107*b* also contacts the conductive film 106 provided at the first part 105*a* of the through hole 105. Therefore, the current flowing from the plunger 108 through the upper part 107*a* of the coil spring 107 to the conductive film 106 can be directly conducted from the conductive film 106 provided at the part 105*a* or the inclined part 105*b* of the first part to the lower part 107*b* of the coil spring 107. At the lower part 107*b*, as explained above, it is possible to form a current path along the long axis direction of the through hole 105. In this way, the conductive film 106 is electrically connected with the lower part 107*b* of the coil spring 107, so the socket 1 according to an embodiment of the present invention can run the signals to the circuit board 30 by a short conductive path without causing inductance at the connecting part of the socket 1 and circuit board 30.

Further, the coil spring 107 is compressed, so the elastic springback force causes the contact part of the plunger 108 and electronic device to be reliably electrically connected to the contact 31 of the circuit board 30 and the lower part 107*b* of the coil spring 107.

In this state, the desired test signals are applied to the electronic device through the circuit board 30 and socket 1 and the output from the electronic device is measured through the socket 1 and circuit board 30.

After the measurement of the electronic device ends, the top frame 3 is pushed down to release the pushing force from the pusher 4 so the electronic device can be taken out from the socket 1 (first state).

As explained above, the electronic device socket according to the embodiment of the present invention forms conductive films at the insides of through holes formed as contact terminals and runs current to places besides the turns of the coil springs serving as the elastic members. For this reason, this electronic device socket enables the conductive paths between the terminals of the electronic device and the contacts of the circuit board to be shortened and enables the occurrence of inductance to be suppressed. Further, by electrical connection of the conductive films of the contact terminals corresponding to the terminals of the electronic device having simultaneously the same potential, the conductive paths of the signals from the terminals of the electronic device to the contacts of the circuit board were enlarged. For this reason, the electronic device socket can reduce the conductive resistance between the terminals of the electronic device and the contacts of the circuit board.

Note that the present invention is not limited to the above embodiment. For example, the present invention may be applied to a socket mounting an electronic device on a circuit board.

Further, for example, the board 10 is comprised of a top plate 103 and bottom plate 102, but the board 10 may also be comprised of three or more plates. Alternatively, the board 10 may also be comprised of a single plate. In this case, it is also possible to form in the plate through holes comprised of first parts having inside diameters substantially the same as or larger than the outside diameters of the lower parts of the coil springs and second parts having inside diameters larger than this. Further, it is also possible to insert into the through holes donut-shaped members having inside diameters larger than the outside diameters of the top parts of the plungers and outside diameters substantially the same as the second parts of the through holes to prevent detachment of the plungers from the board 10.

In the above way, a person skilled in the art can make various changes in accordance with the mode of working within the scope of the present invention.

The invention claimed is:

1. An electronic device socket provided with a socket part electrically connecting a plurality of terminals of an electronic device to corresponding contacts of a circuit board and able to move between a first state where no electronic device is attached to a second state where an electronic device is attached, said terminals and said contacts being electrically connected, said socket part comprising:

a plurality of through holes arranged corresponding to the positions of the plurality of terminals of the electronic device and opening at a top surface of said socket part facing the electronic device and a bottom surface facing the circuit board, wherein said socket part comprising, at each of said plurality of through holes:

an elastic member comprised of a coil spring, provided with an upper part wound in a coil shape and having elasticity along a longitudinal direction of said through hole and a lower part wound in a coil shape more densely than said upper part and able to form a conductive path substantially parallel to an extension direction of said through hole, and inserted into said through hole, a plunger having conductivity inserted into said through hole and biased from said elastic member toward said top surface in at least said second state, and a conductive film formed at an inner surface of said through hole, such that bar said first state a bottom end of said plunger is positioned above said lower part of said coil spring, and said plunger tilts and physically contacts said lower part of said elastic member when said elastic member is compressed in said second state.

2. An electronic device socket as set forth in claim 1 wherein said plunger is provided with a bottom part inserted into said upper part of said elastic member and a top part extending to said top surface side of said socket part at the outside of said elastic member, and when the electronic device is placed on said socket part, said bottom part is electrically connected with the conductive film through said upper part of said elastic member.

3. An electronic device socket as set forth in claim 1 wherein an outside diameter of the upper part of said elastic member is larger than an inside diameter of said through hole where the lower part of said elastic member is arranged.

4. An electronic device socket as set forth in claim 1 wherein the end of said conductive film at said bottom surface side is positioned at said top surface side from said bottom surface.

5. An electronic device socket as set forth in claim 1 wherein said socket part further comprising a conductive layer electrically connecting the plurality of said conductive films.

* * * * *

UNITED STATES PATENT AND TRADEMARK OFFICE
CERTIFICATE OF CORRECTION

PATENT NO. : 8,556,638 B2
APPLICATION NO. : 13/061808
DATED : October 15, 2013
INVENTOR(S) : Yuichi Tsubaki et al.

It is certified that error appears in the above-identified patent and that said Letters Patent is hereby corrected as shown below:

In the Claims

Column 11
Line 2, in claim 1, delete "that bar said" and insert -- that in said --

Signed and Sealed this
First Day of April, 2014

Michelle K. Lee
*Deputy Director of the United States Patent and Trademark Office*